(12) United States Patent
Cai et al.

(10) Patent No.: US 9,331,097 B2
(45) Date of Patent: May 3, 2016

(54) HIGH SPEED BIPOLAR JUNCTION TRANSISTOR FOR HIGH VOLTAGE APPLICATIONS

(71) Applicant: International Business Machines Corporation, Armonk, NY (US)

(72) Inventors: Jin Cai, Cortlandt Manor, NY (US); Tak H. Ning, Yorktown Heights, NY (US); Jeng-bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/195,851

(22) Filed: Mar. 3, 2014

(65) Prior Publication Data

US 2015/0249085 A1 Sep. 3, 2015

(51) Int. Cl.
*H01L 27/12* (2006.01)
*H01L 27/06* (2006.01)
*H01L 27/07* (2006.01)

(52) U.S. Cl.
CPC ......... *H01L 27/1203* (2013.01); *H01L 27/0623* (2013.01); *H01L 27/0705* (2013.01)

(58) Field of Classification Search
None
See application file for complete search history.

(56) References Cited

U.S. PATENT DOCUMENTS

| | | | | |
|---|---|---|---|---|
| 4,506,282 A | * | 3/1985 | Baliga | 257/273 |
| 5,349,227 A | * | 9/1994 | Murayama | 257/361 |
| 6,255,694 B1 | | 7/2001 | Mandelman et al. | 257/350 |
| 6,278,143 B1 | | 8/2001 | Ejiri | 257/273 |
| 6,972,466 B1 | * | 12/2005 | Liang et al. | 257/370 |
| 7,351,620 B2 | | 4/2008 | Bhattacharyya | 438/152 |
| 7,535,016 B2 | | 5/2009 | Furukawa et al. | 257/20 |
| 7,939,857 B1 | | 5/2011 | Wyatt | 257/205 |
| 8,288,758 B2 | | 10/2012 | Ning et al. | 257/19 |
| 8,305,803 B2 | | 11/2012 | Mazure et al. | 365/177 |
| 8,420,493 B2 | | 4/2013 | Ning et al. | 438/311 |
| 8,441,084 B2 | | 5/2013 | Cai et al. | 257/423 |
| 8,526,220 B2 | | 9/2013 | Cai et al. | 365/156 |
| 8,531,001 B2 | | 9/2013 | Cai et al. | 257/526 |
| 8,557,670 B1 | | 10/2013 | Cai et al. | 438/316 |

(Continued)

FOREIGN PATENT DOCUMENTS

| | | | | |
|---|---|---|---|---|
| JP | 61222249 | | 10/1986 | H01L 27/06 |
| JP | 4133516 | | 5/1992 | H03K 17/04 |
| JP | 07131037 | * | 5/1995 | H01L 29/861 |
| JP | 7131037 | | 5/1995 | H01L 29/861 |

OTHER PUBLICATIONS

Cai, J. et al. "Complementary Thin-Base Symmetric Lateral Bipolar Transistors on SOI" IEDM11-386, pp. 16.3.1-16.3.4 (2011).

(Continued)

*Primary Examiner* — Mohammad Islam
*Assistant Examiner* — Mikka Liu
(74) *Attorney, Agent, or Firm* — Ido Tuchman; Louis J. Percello (57) ABSTRACT

High speed bipolar junction transistor switches for high voltage operations. An example switch includes a bipolar junction transistor including a collector region positioned over a buried insulator region. The collector region includes dopants of a first conductivity type. A field effect transistor includes a source region also positioned over a buried insulator region. The source region electrically is coupled to the collector region such that all current passing the collector region enters the source region.

15 Claims, 6 Drawing Sheets

(56) References Cited

U.S. PATENT DOCUMENTS

| | | | |
|---|---|---|---|
| 8,558,282 B1 | 10/2013 | Cai et al. | 257/197 |
| 2011/0170343 A1 | 7/2011 | Mazure et al. | 365/174 |
| 2012/0235151 A1 | 9/2012 | Cai et al. | 257/65 |

OTHER PUBLICATIONS

Cai, J. et al. "SOI Lateral Bipolar Transistor with Drive Current >3mA/µm", pp. 1-2.

* cited by examiner

HIGH SPEED BIPOLAR JUNCTION TRANSISTOR FOR HIGH VOLTAGE APPLICATIONS

BACKGROUND

The present invention relates to electrical circuit switches. More particularly, the present invention relates to bipolar junction transistor switches.

Bipolar Junction Transistors (BJT) are transistors commonly utilized as amplifiers, switches, and oscillators. The operation of BJTs relies on charge carrier movement from an emitter region to a collector region via a base region. The emitter regions are commonly doped with a first conductivity type, and the base region doped with a second conductivity type. For a BJT where the first conductivity type is n-type and the second conductivity type is p-type, during operation, the emitter region is forward biased to drive electron carriers from the n-type emitter through the p-type base region to the collector region, while the collector region is reverse biased to prevent electron carriers from travelling from the collector region to the base region.

In a semiconductor, electron carriers (negative charge carriers) move about in the conduction band and hole carriers (positive charge carriers) move about in the valence band. In the space-charge region of a p-n junction, for example the space-charge region of base-collector junction of a BJT, there is an electric field due to the voltage differential between the p-type region and the n-type region of the p-n junction. The larger the voltage differential, the larger the electric field. When electron and hole carriers move about in a space-charge region with electric field, they can gain enough energy from the electric field to dislodge fixed electrons (non-carrier electrons), lifting them from the valence band to the conduction band. Once lifted from the valence band to the conduction band, the dislodged electrons are electron carriers and are free to move about in the conduction band. For each electron thus lifted from the valence band to the conduction band, a hole carrier is created in the valence band. The hole carriers thus created are free to move about in the valence band. The process in which a high-energy electron or hole carrier dislodges a fixed electron to create an electron carrier in the conduction band and a hole carrier in the valence band is known as impact ionization. At high enough voltage between the p-type region and the n-type region, the electron and hole carriers created in the impact ionization process can themselves undergo impact ionization processes and create more electron and hole carriers. At still higher voltage between the p-type region and the n-type region, the cascading impact ionization processes multiply into what is commonly known as avalanche breakdown.

For certain applications, such as power and motor switches, BJTs often require relatively high voltages across the emitter and collector regions. The voltage across the emitter and collector regions at which avalanche breakdown occurs in the base-collector junction is the collector to emitter breakdown voltage (BVCEO). For reliable operation, the voltage across the emitter and collector regions must be less than the breakdown voltage BVCEO of the BJT.

In order to address avalanche breakdown in such bipolar junction transistor applications, a common approach is to lightly dope the collector region. For a given voltage across a p-n junction, the electric field is smaller when the dopant concentration of the p-type region, the n-type region, or both the p-type and n-type regions, is reduced. Thus, a BJT having a lightly doped collector region has a larger collector emitter breakdown voltage than a BJT having a more heavily doped collector region. However, a lightly doped collector region also means low charge carrier density in the collector region, and hence low current carrying capability for the BJT.

In the operation of a BJT, charge carriers are injected from the emitter region into the base region. As these charge carriers traverse the base region and reach the collector region, they become the charge carriers in the collector region. A BJT operated to carry a large current implies a large density of charge carriers injected from the emitter region and reaching the collector region. When the density of charge carriers in the collector, injected from the emitter, is larger than the dopant density of the collector region, there is a corresponding rise in the density of charge carriers of the opposite polarity in the collector in order to maintain local charge neutrality in the collector region. (Charge neutrality means there is no net charge, positive or negative, present in the region.) In other words, when the density of charge carriers in the collector, injected from the emitter, is larger than the dopant density of the collector region, the BJT behaves as if a corresponding amount of charge carriers of the opposite polarity from the base are pushed into, and accumulate in, the collector region. This phenomenon, commonly referred to as the Kirk Effect or base pushout, increases transit times (particularly on-to-off-time). Therefore, in conventional BJT design, there is a design conflict between large current carrying capability which requires high collector dopant density, and large collector-emitter breakdown voltage which requires low collector dopant density. As such, the conventional BJT is simply inferior for high speed, high voltage applications, such as power and motor switches.

BRIEF SUMMARY

An aspect of the present invention is an electrical circuit for high speed switching with a high breakdown voltage including a first buried insulator region. The electrical circuit includes a bipolar junction transistor. The bipolar junction transistor includes a collector region positioned over the first buried insulator region. The collector region includes dopants of a first conductivity type. The electrical circuit also includes a second buried insulator region and a field effect transistor. The field effect transistor includes a source region positioned over the second buried insulator region. The source region includes dopants of the first conductivity type. The source region is electrically coupled to the collector region such that all current passing the collector region enters the source region.

Another aspect of the present invention is a three-terminal transistor device comprising a bipolar junction transistor including an emitter region electrically coupled to a first terminal. The bipolar junction transistor also includes a collector. The bipolar junction transistor includes a base region positioned between the emitter region and the collector region. The base region controls charge flow from the emitter region to the collector region, and is electrically coupled to a second terminal. The three-terminal transistor also includes a field effect transistor including a source region electrically coupled to the collector region such that all current passing the collector region enters the source region. The field effect transistor also includes a gate region electrically coupled to the source region and a third terminal. The field effect transistor includes a drain region electrically coupled to the gate region and the third terminal.

DETAILED DESCRIPTION

It is initially noted that the configurations described below and depicted in the figures are for the purpose of illustrating suggested embodiments of the present invention. Therefore, the present invention encompasses alternative orientations and configurations of the suggested embodiments. Throughout the description of the invention reference is made to FIGS. 1-6. When referring to the figures, like structures and elements shown throughout are indicated with like reference numerals.

An aspect of the invention is a lateral symmetrical silicon-on-insulator (SOI) BJT with a field effect transistor (FET) effectively acting as the collector terminal, such that the BJT and FET are coupled via a floating region. Thus, the FET provides negative feedback for the collector-base voltage, while the symmetrically doped emitter and collector regions allow for low transit times.

Figure 1:
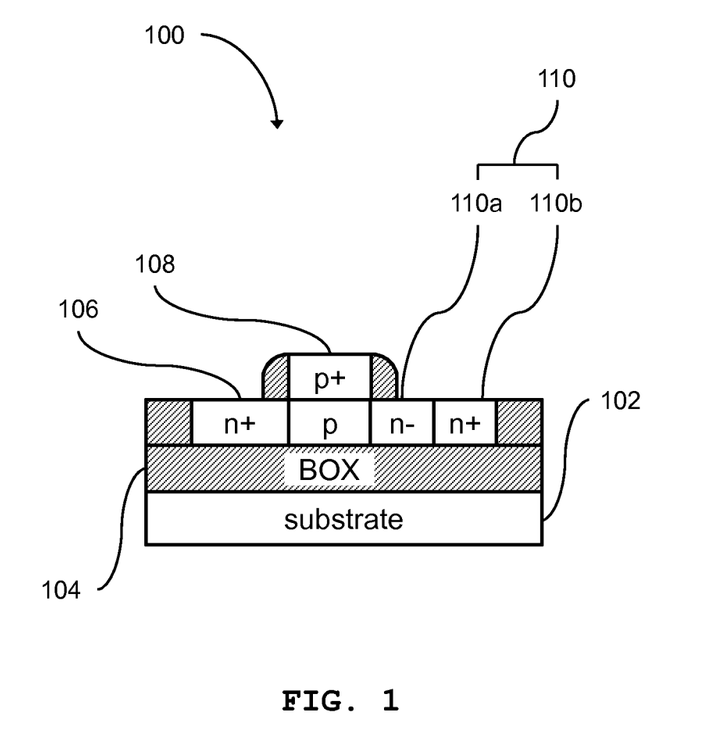
FIG. 1 is a simplified block diagram illustrating a conventional bipolar junction transistor switch operating with large collector to emitter voltage.

FIG. 1 is a simplified block diagram illustrating a prior art bipolar junction transistor switch 100 designed for operating with high collector to emitter voltage. The bipolar junction transistor switch 100 includes a substrate 102, and a buried insulator layer 104 positioned on top of the substrate 102. The bipolar junction transistor switch 100 also includes an emitter region 106, a base region 108, and a collector region 110. The bipolar junction transistor switch 100 is configured as an NPN scheme, such that the emitter region 106 is an N-type doped semiconductor material, the base region is a P-type doped semiconductor material, and the collector region is an N-type doped semiconductor material. In designing the BJT 100 as a switch for operation with large collector to emitter voltage, the collector region 110 has a relatively lightly doped region 110a adjacent the base region 108. The heavily doped collector region 110b provides electrical connection to the lightly doped collector region 110a. The current carrying capability of the BJT 100 and the maximum collector to emitter voltage for the BJT 110 are determined by the lightly doped collector region 110a. The collector to emitter breakdown voltage BVCEO of the BJT 100 can be increased by reducing the dopant concentration of the lightly doped collector region 110a, but the maximum current the transistor can carry without detrimental base pushout effect is reduced, resulting in a slower transistor switch.

An objective in designing an improved transistor device according to the present invention is to achieve both large breakdown voltage and large current carrying capability.

Figure 2:
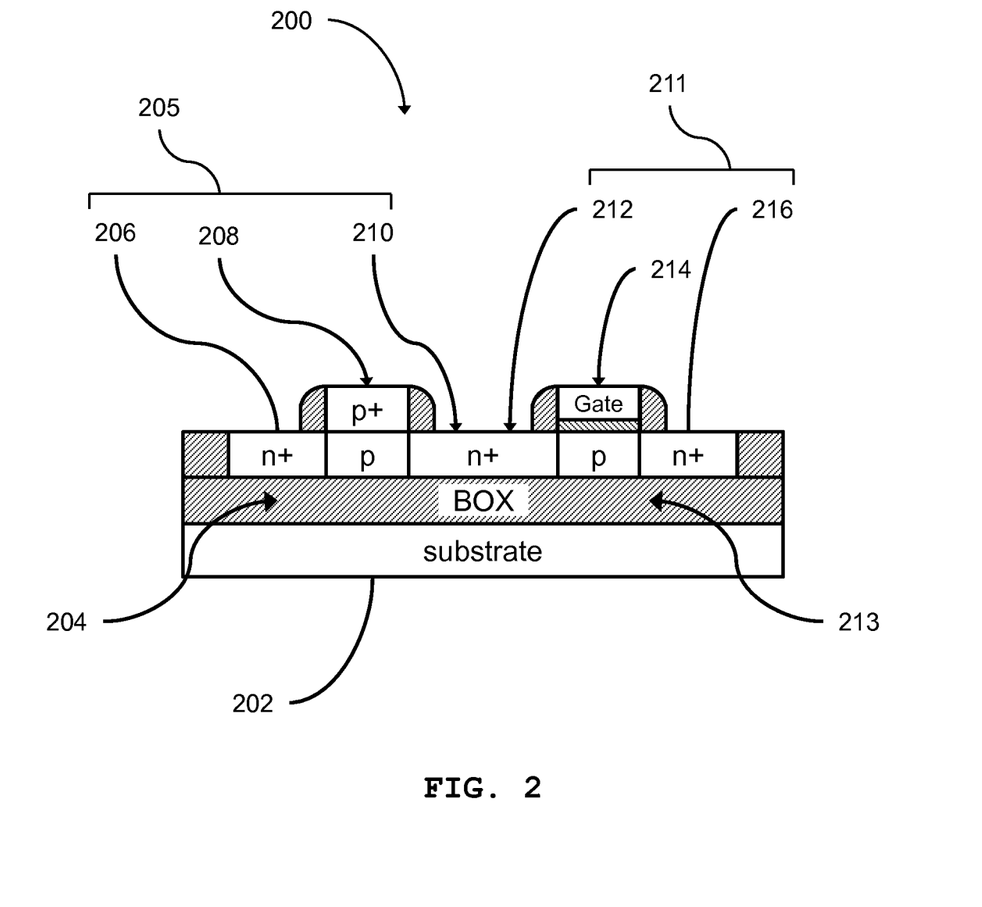
FIG. 2 is a simplified block diagram illustrating an electrical circuit switch according to one embodiment of the present invention.

FIG. 2 is a simplified block diagram illustrating an electrical circuit switch 200, according to one embodiment of the present invention. The electrical circuit switch 200 includes a substrate 202 and a bipolar junction transistor 205. The electrical circuit switch 200 is an SOI device, such that it includes a first buried insulator region 204 positioned between the substrate 202 and bipolar junction transistor 205. The bipolar junction transistor 205 includes an emitter region 206, base region 208, and a collector region 210, such that the collector region 210 is positioned on top of the first buried insulator region 204. In this embodiment, the entire bipolar junction transistor 205 is positioned on top of the first buried insulator region 204. This embodiment is commonly referred to as a lateral bipolar junction transistor, wherein the emitter region 206, base region 208, and collector region 210 are laterally aligned. Charge carriers from the emitter flow laterally via the base to the collector, with the base region controlling charge flow from the emitter region to the collector region.

The emitter region 206 and collector region 210 both include dopants of a first conductivity type, and the base region 208 includes dopants of a second conductivity type. In the embodiment show in FIG. 2, the bipolar junction transistor 205 is configured as an NPN BJT, such that the emitter region 206 and collector region 210 consist of N-type doped semiconductor materials (first conductivity type), and the base region 208 consists of P-type doped semiconductor materials (second conductivity type). The bipolar junction transistor 205 may be configured as a symmetrical BJT, such that the emitter region 206 and collector region 210 are doped with substantially the same dopant concentration. The symmetrical doping reduces the bipolar junction transistor's 205 susceptibility to base pushout, and switching speed degradation.

The electrical circuit switch 200 may also include a second buried insulator region 213. In this embodiment, the first buried insulator region 204 and the second buried insulator region 213 are physically continuous as a single insulator layer. However, it should be noted that in some embodiments, the first insulator region 204 and the second insulator region 213 may be physically separate. In such embodiments, the first and second insulator regions may share the same substrate, or may be positioned on a second substrate, separate from the substrate 202 under the first insulator region 204 (depicted in FIG. 5).

The electrical circuit switch 200 also includes a field effect transistor 211. The field effect transistor 211 includes a source region 212, a gate region 214, and a drain region 216, such that the source region 212 is positioned on top of the second buried insulator region 213.

The source region 212 is electrically coupled to the collector region 210. As the collector region 210 and the source region 212 are positioned on top of the second insulator region 213, all current passing the collector region 210 enters the source region 212. The collector region 210 and source region 212 form a floating region with effectively no leakage current. As such, the electrical circuit switch 200 may operate as a single transistor.

In this embodiment, the source region 212 and collector region 210 are a physically continuous region. The flow of charge carriers from the source region to the drain region is controlled by the voltage across the gate region and the source region. The source region 212 and drain region 216 may include dopants of the first conductivity type. The gate region 214 may include an electrically conducting material and an electrically insulating material. In this embodiment, the field effect transistor 211 is configured as an nFET, such that the source region 212 and drain region 216 consist of N-type doped semiconductor materials. However, in other embodiments, a PNP BJT may be paired with a pFET configuration (as disclosed in FIGS. 4A & 4B).

Figure 3:
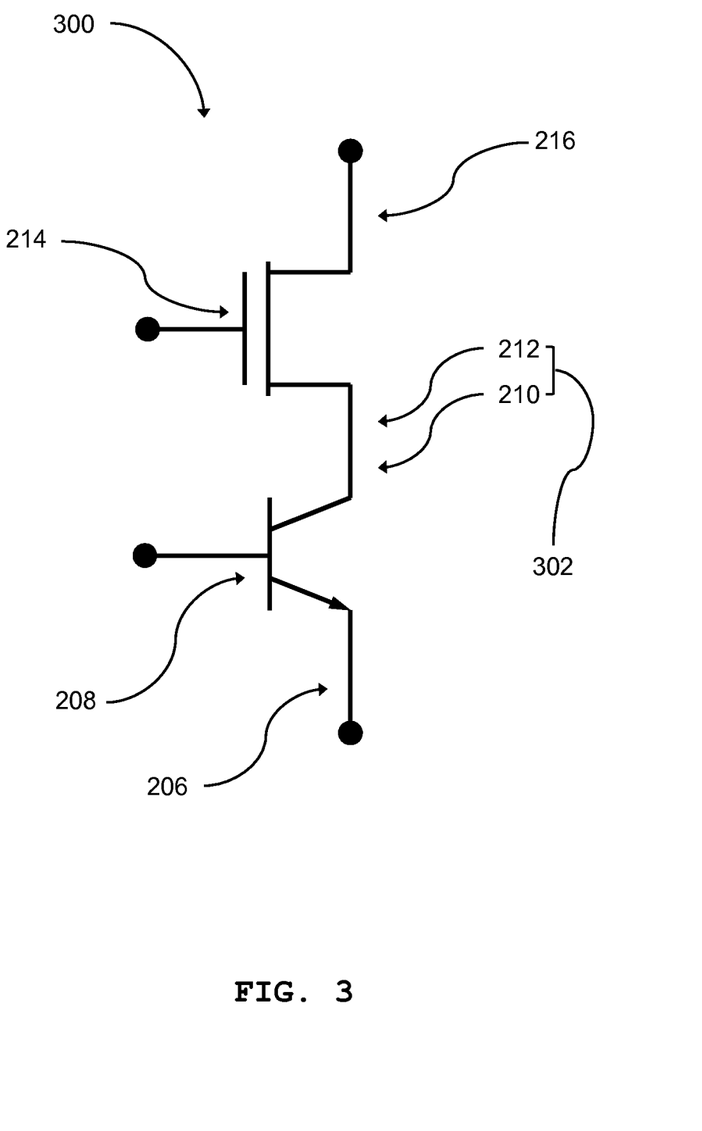
FIG. 3 is a circuit diagram of an electrical circuit according to one embodiment of the present invention.

FIG. 3 is a circuit diagram of an electrical circuit switch 300, according to one embodiment of the present invention.

The circuit diagram may also be employed to analyze embodiments of electrical circuit switch 200. The circuit diagram depicts the bipolar junction transistor 205 and the field effect transistor 211 electrically coupled via the floating region 302. The floating region 302 effectively has no leakage current, such that the current at the collector region 210 is equal to the current through the field effect transistor 211. Consequently, the drain region 216 of the field effect transistor 211 effectively acts as a collector terminal for the bipolar junction transistor 205. The voltage across the source region 212 and gate region 214 of the field effect transistor 211 acts as a negative feedback component, reducing the voltage across the base region 208 and the collector region 210. Thus, the BVCEO can be effectively increased, while maintaining minimum transit times during switching.

In this embodiment, the electrical circuit switch is a four terminal switch. As such, the gate region 214 of the field effect transistor 211 may be biased separately from the bipolar junction transistor 205. Additionally, the bipolar junction transistor 205 may be switched on and off independent of the field effect transistor 211, as the base region 208 is not affected by the capacitance load of the field effect transistor 211.

Figure 4A:
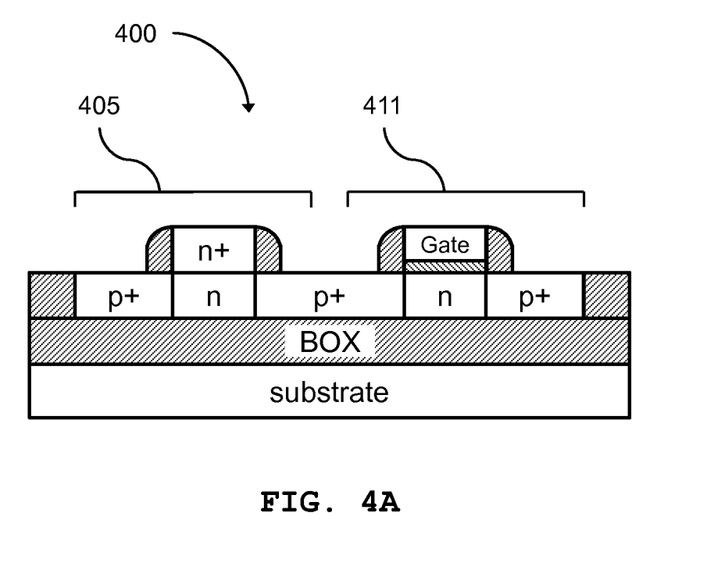
FIG. 4A is a simplified block diagram illustrating an electrical circuit switch according to one embodiment of the present invention.
Figure 4B:
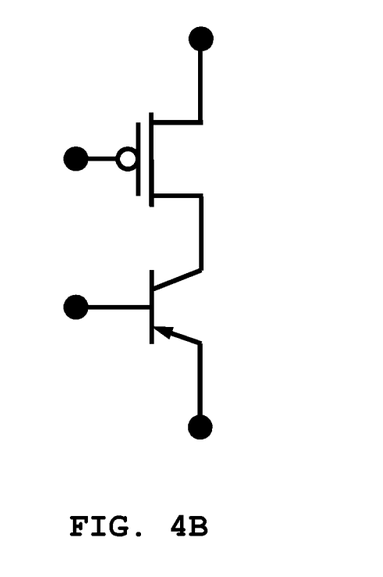
FIG. 4B is a circuit diagram of an electrical circuit according to the embodiment depicted in FIG. 4A.

FIG. 4A is a simplified block diagram illustrating an electrical circuit switch 400 according to one embodiment of the present invention. In this embodiment, the bipolar junction transistor 405 consists of a PNP configuration, and the field effect transistor 411 consists of a pFET configuration. As such, the first conductivity type is P-type, and the second conductivity type is N-type. FIG. 4B is a circuit diagram of the electrical circuit switch 400 in FIG. 4A.

Figure 5:
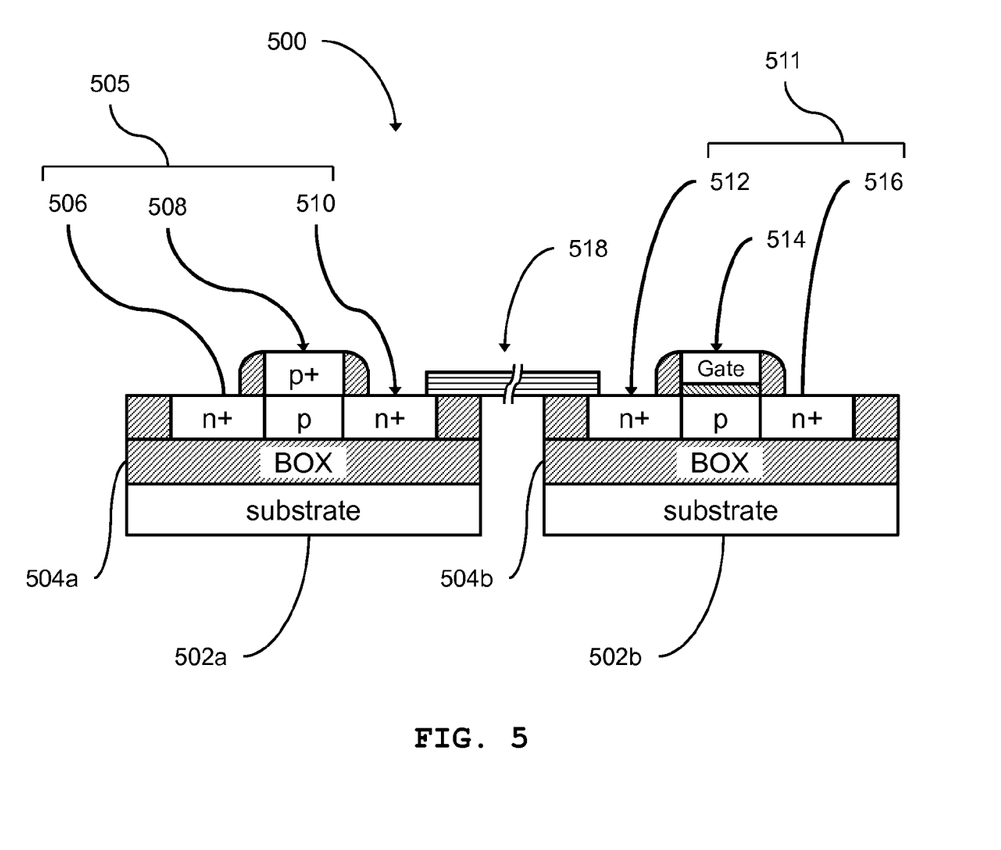
FIG. 5 is a simplified block diagram illustrating an electrical circuit switch according to one embodiment of the present invention.

FIG. 5 is a simplified block diagram illustrating an electrical circuit switch 500, according to one embodiment of the present invention. This embodiment includes a first substrate 502a physically separate from a second substrate 502b. Accordingly, the first buried insulator region 504a is physically separate from the second buried insulator region 504b. In this embodiment, the bipolar junction transistor 505 is positioned on top of the first buried insulator region 504a, and the field effect transistor 511 is positioned on top of the second buried insulator region 504b. A first insulator layer (also indicated as 504a) may be physically separate from a second insulator layer (also indicated as 504b). In this embodiment, the electrical circuit switch 500 also includes a floating contact 518 for electrically coupling the collector region 510 with the source region 512. The floating contact 518 is electrically coupled only to the collector region 510 and source region 512, as such there is effectively no leakage current in the floating contact 518.

Figure 6:
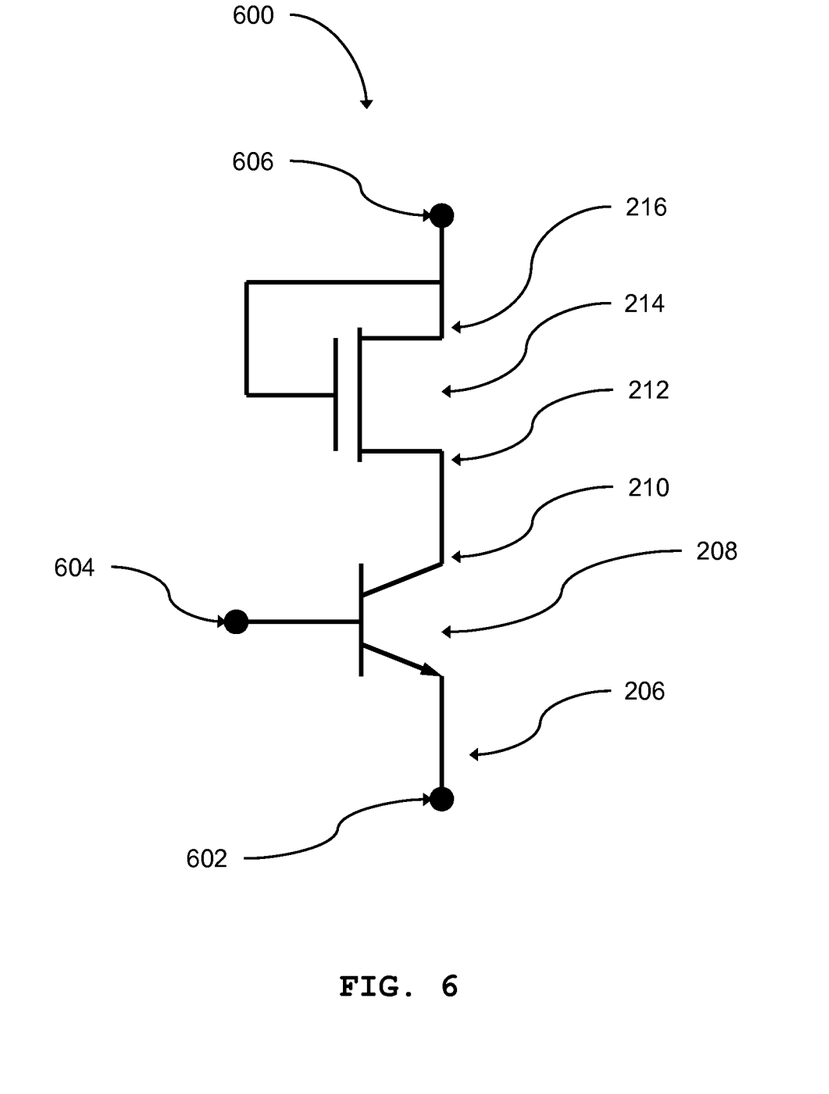
FIG. 6 is a circuit diagram of a three-terminal transistor device according to one embodiment of the present invention.

FIG. 6 is a circuit diagram of a three-terminal transistor device 600, according to one embodiment of the present invention. The transistor device 600 includes a first terminal 602, a second terminal 604, and a third terminal 606. The first terminal 602 is electrically coupled to the emitter region 206. The second terminal 604 is electrically coupled to the base region 208. The third terminal 606 is electrically coupled to the gate region 214 and the drain region 216. As such, the three-terminal transistor device 600 functions as a single transistor.

The three-terminal transistor device 600 may be fabricated, for example, in accordance with the block diagrams illustrated in FIGS. 2, 4 and 5. Thus, the three-terminal transistor may be configured such that the first conductivity type is n-type and the second conductivity type is p-type. Alternatively, the first conductivity type may be p-type and the second conductivity type is n-type.

Furthermore, the collector region and the source region may be physically in contact or may be physically separated. As discussed above, the emitter region, base region, and collector region are laterally aligned. Additionally, the emitter region and collector region may have substantially equal dopant concentrations.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A three-terminal transistor device comprising:
a bipolar junction transistor including:
an emitter region electrically coupled to a first terminal;
a collector region; and
a base region positioned between the emitter region and the collector region, the base region controlling charge flow from the emitter region to the collector region, the base region electrically coupled to a second terminal;
a field effect transistor including:
a source region electrically coupled to the collector region such that all current passing the collector region enters the source region;
a gate region electrically coupled to a third terminal; and
a drain region electrically coupled to the gate region and the third terminal;
wherein the emitter region and the collector region include dopants of a first conductivity type, and the base region includes dopants of a second conductivity type;
wherein the source region and the drain region include dopants of the first conductivity type; and
wherein the first conductivity type is p-type and the second conductivity type is n-type.

2. The three-terminal transistor device of claim 1, wherein the collector region and the source region are physically in contact.

3. The three-terminal transistor device of claim 1, wherein the collector region and the source region are physically separated.

4. The three-terminal transistor device of claim 1, wherein the emitter region, base region, and collector region are laterally aligned.

5. The three-terminal transistor device of claim 4, wherein the emitter region and collector region have equal dopant concentrations.

6. A three-terminal transistor device comprising:
a bipolar junction transistor including:
an emitter region electrically coupled to a first terminal;
a collector region; and
a base region positioned between the emitter region and the collector region, the base region controlling charge flow from the emitter region to the collector region, the base region electrically coupled to a second terminal;
a field effect transistor including:
a source region electrically coupled to the collector region such that all current passing the collector region enters the source region;

a gate region electrically coupled to a third terminal; and
a drain region electrically coupled to the gate region and the third terminal;
wherein the emitter region and the collector region include dopants of a first conductivity type, and the base region includes dopants of a second conductivity type;
wherein the emitter region, base region, and collector region are laterally aligned; and
wherein the emitter region and collector region have equal dopant concentrations.

7. The three-terminal transistor device of claim 6, wherein the collector region and the source region are physically in contact.

8. The three-terminal transistor device of claim 6, wherein the collector region and the source region are physically separated.

9. The three-terminal transistor device of claim 6, wherein the source region and the drain region include dopants of the first conductivity type.

10. The three-terminal transistor device of claim 9, wherein the first conductivity type is n-type and the second conductivity type is p-type.

11. The three-terminal transistor device of claim 9, wherein the first conductivity type is p-type and the second conductivity type is n-type.

12. A three-terminal transistor device comprising:
a bipolar junction transistor including:
an emitter region electrically coupled to a first terminal;
a collector region; and
a base region positioned between the emitter region and the collector region, the base region controlling charge flow from the emitter region to the collector region, the base region electrically coupled to a second terminal;
a field effect transistor including:
a source region electrically coupled to the collector region such that all current passing the collector region enters the source region;
a gate region electrically coupled to a third terminal; and
a drain region electrically coupled to the gate region and the third terminal;
wherein the emitter region and the collector region include dopants of a first conductivity type, and the base region includes dopants of a second conductivity type;
wherein the source region and the drain region include dopants of the first conductivity type;
wherein the first conductivity type is n-type and the second conductivity type is p-type; and
wherein the emitter region and collector region have equal dopant concentrations.

13. The three-terminal transistor device of claim 12, wherein the collector region and the source region are physically in contact.

14. The three-terminal transistor device of claim 12, wherein the collector region and the source region are physically separated.

15. The three-terminal transistor device of claim 12, wherein the emitter region, base region, and collector region are laterally aligned.

* * * * *